United States Patent
Bäcklund

(10) Patent No.: US 9,912,308 B2
(45) Date of Patent: Mar. 6, 2018

(54) TUBE AMPLIFIER ASSEMBLY HAVING A POWER TUBE AND A CAPACITOR ASSEMBLY

(71) Applicant: General Electric Company, Schenectady, NY (US)

(72) Inventor: Andreas Bäcklund, Uppsala (SE)

(73) Assignee: General Electric Company, Schenectady, NY (US)

(*) Notice: Subject to any disclaimer, the term of this patent is extended or adjusted under 35 U.S.C. 154(b) by 87 days.

(21) Appl. No.: 15/242,933

(22) Filed: Aug. 22, 2016

(65) Prior Publication Data

US 2016/0359462 A1   Dec. 8, 2016

Related U.S. Application Data

(62) Division of application No. 14/575,914, filed on Dec. 18, 2014, now Pat. No. 9,455,674.

(51) Int. Cl.

| | |
|---|---|
| *H03F 3/22* | (2006.01) |
| *H03F 3/189* | (2006.01) |
| *H01G 4/002* | (2006.01) |
| *H01J 23/12* | (2006.01) |
| *H01G 4/30* | (2006.01) |
| H01G 4/228 | (2006.01) |
| H01G 4/40 | (2006.01) |
| H05H 7/02 | (2006.01) |

(52) U.S. Cl.
CPC ............. *H03F 3/22* (2013.01); *H01G 4/002* (2013.01); *H01G 4/30* (2013.01); *H01J 23/12* (2013.01); *H03F 3/189* (2013.01); H01G 4/40 (2013.01); H03F 2200/267 (2013.01); H03F 2200/451 (2013.01); H05H 2007/025 (2013.01)

(58) Field of Classification Search
CPC ............. H03F 3/22; H03F 3/189; H01G 4/228
USPC ......................... 333/24 C; 330/43, 44, 65, 67
See application file for complete search history.

(56) References Cited

U.S. PATENT DOCUMENTS

| | | |
|---|---|---|
| 2,551,715 A | 5/1951 | Young |
| 2,740,848 A | 4/1956 | Starner et al. |

(Continued)

OTHER PUBLICATIONS

Whitaker, Jerry C., Power Vacuum Tubes Handbook 2nd Edition, Chapter 5, "Applying Vacuum Tube Devices" (2000).

(Continued)

*Primary Examiner* — Dean Takaoka
(74) *Attorney, Agent, or Firm* — Dean D. Small; The Small Patent Law Group, LLC

(57) ABSTRACT

Tube amplifier assembly including a power tube that is configured to be coupled to a grounding deck and positioned within an opening of the grounding deck. The tube amplifier assembly also includes a tube adapter that is configured to be coupled to the grounding deck. The tube adapter has a capacitive plate that extends parallel to the grounding deck and an adapter wall that is coupled to the capacitive plate. The tube adapter has an adapter opening that is aligned with the deck opening to form a tube passage. The tube adapter includes flexible conductive elements that are electrically coupled to the capacitive plate and surround the tube passage. The flexible conductive elements engage the power tube in the tube passage and electrically couple the power tube to the capacitive plate. The grounding deck and the capacitive plate form a capacitor assembly.

20 Claims, 12 Drawing Sheets

(56) References Cited

U.S. PATENT DOCUMENTS

| | | | |
|---|---|---|---|
| 3,016,400 A | 1/1962 | De Loach et al. | |
| 3,323,073 A | 5/1967 | Lavoo | |
| 3,394,283 A * | 7/1968 | Mann | H01J 23/207 |
| | | | 315/5.48 |
| 3,748,513 A * | 7/1973 | Levin | H01J 23/15 |
| | | | 313/30 |
| 3,784,911 A | 1/1974 | Ramstrom | |
| 3,904,995 A | 9/1975 | Phillips | |
| 6,417,634 B1 | 7/2002 | Bergstrom | |
| 6,724,261 B2 | 4/2004 | Cheo | |
| 7,339,366 B2 | 3/2008 | Li | |
| 7,982,561 B2 | 7/2011 | Mendenhall | |
| 8,106,570 B2 | 1/2012 | Norling et al. | |
| 8,153,997 B2 | 4/2012 | Norling et al. | |
| 8,169,277 B2 | 5/2012 | Mcintyre et al. | |
| 8,653,762 B2 | 2/2014 | Eriksson et al. | |
| 9,337,786 B1 * | 5/2016 | Holmgren | H01G 4/228 |
| 9,455,674 B2 * | 9/2016 | Backlund | H01G 4/002 |
| 9,456,532 B2 * | 9/2016 | Backlund | H05H 15/00 |
| 9,515,616 B2 * | 12/2016 | Backlund | H01G 5/01 |

OTHER PUBLICATIONS

Tube Amplification Unit (TAU) of General Electric MINITrace, Part No. 907630 (1999).

Kurkin, G.Y., "Other RF Power Sources," In Frontiers of Accelerator Technology (1999).

MINITrace Qilin: Installation Manual, Revision 13 (2014), pp. 1-16 and 217-223.

MINITrace Qilin: Service Manual, Revision 14 (2014), pp. 361-363 and 423-429.

\* cited by examiner

TUBE AMPLIFIER ASSEMBLY HAVING A POWER TUBE AND A CAPACITOR ASSEMBLY

CROSS-REFERENCE TO RELATED APPLICATIONS

The present application is a divisional of U.S. application Ser. No. 14/575,914, which was filed on Dec. 18, 2014 and is incorporated herein by reference in its entirety.

The subject matter set forth herein is similar to subject matter described in U.S. application Ser. Nos. 14/575,885; 14/575,958; and 14/575,993. Each of the above applications is incorporated herein by reference in its entirety.

BACKGROUND

The subject matter herein relates generally to radio-frequency (RF) power generators and, more particularly, to RF power generators that utilize power electron vacuum tubes.

Radioisotopes (also called radionuclides) have several applications in medical therapy, imaging, and research, as well as other applications that are not medically related. Systems that produce radioisotopes typically include a particle accelerator, such as a cyclotron, that accelerates a beam of charged particles (e.g., H⁻ ions) and directs the beam into a target material to generate the isotopes. The cyclotron includes a particle source that provides the particles to a central region of an acceleration chamber. The cyclotron uses electrical and magnetic fields to accelerate and guide the particles along a predetermined orbit within the acceleration chamber. The magnetic fields are provided by electromagnets and a magnet yoke that surrounds the acceleration chamber. The electrical fields are generated by a pair of radio frequency (RF) electrodes (or dees) that are located within the acceleration chamber. The RF electrodes are electrically coupled to an RF power generator that may include, for example, oscillators, amplifiers, control circuitry, and power supplies. The RF power generator energizes the RF electrodes to provide the electrical field. The electrical and magnetic fields within the acceleration chamber cause the particles to take a spiral-like orbit that has an increasing radius. When the particles reach an outer portion of the orbit, the particles are directed toward the target material for radioisotope production. In addition to controlling the orbit of the particles, the RF electrodes may be used to pull the particles from a particle source in the acceleration chamber.

To operate the RF electrodes within the acceleration chamber, a considerable amount of electric power (e.g., 5 kW to 2 MW) is generated by the RF power generator and delivered to the RF electrodes. The power generator includes, among other things, a tube amplifier unit having a power electron vacuum tube (or power tube). The power tube is typically mounted to a grounding deck that separates a cathode cavity and an anode cavity. The power tube may be, for example, a power triode having a cathode, anode, and control grid. In a power triode, the cathode is heated by a filament that receives current from a power supply. The heated filament causes the cathode to emit electrons, which flow through the vacuum tube toward the anode. The control grid is positioned between the cathode and anode and may be used to control the flow of the electrons. Other power tubes utilized by power generators may include a tetrode and a pentode.

A socket is often used to mechanically and electrically couple the power tube to the grounding deck. The socket, however, can be expensive and can limit the options available for controlling the electrical performance of the RF amplification system. An alternative to the socket connection includes using flexible leads (also called flying leads) that are electrically coupled to the filament and are used to heat the filament during operation of the power tube. It can be a challenge, however, to connect the power tube to the grounding deck without a socket and be capable of operating within the very high frequency (VHF) band or higher while achieving a designated efficiency. For example, it is not recommended to operate power tubes with flexible leads at 100 MHz and above. Moreover, it may be desirable to monitor signals at the cathode resonator to control electrical performance. Socket-mounted power tubes, however, may require that a separate device be installed for monitoring the signals.

BRIEF DESCRIPTION

In an embodiment, a tube amplifier assembly is provided that includes a grounding deck having an anode side and a cathode side that face in opposite directions. The grounding deck has a deck opening therethrough that extends transverse to a central axis. The tube amplifier assembly also includes a power tube that is coupled to the grounding deck and positioned within the deck opening. The tube amplifier assembly also includes a tube adapter coupled to the grounding deck and positioned along the cathode side. The tube adapter has a capacitive plate that extends parallel to the grounding deck and an adapter wall that is coupled to the capacitive plate. The tube adapter has an adapter opening that is aligned with the deck opening to form a tube passage. The tube adapter includes flexible conductive elements that are electrically coupled to the capacitive plate and surround the tube passage. The flexible conductive elements engage the power tube in the tube passage and electrically couple the power tube to the capacitive plate. The grounding deck and the capacitive plate form a capacitor assembly of the tube amplifier assembly.

In an embodiment, a tube amplifier assembly is provided that includes a grounding deck having an anode side and a cathode side that face in opposite directions. The grounding deck having a deck opening therethrough. The tube amplifier assembly also includes a capacitive plate extending parallel to the grounding deck and an interposed plate extending parallel to and positioned between the grounding deck and the capacitive plate. The interposed plate is electrically separated from the grounding deck and the capacitive plate. The capacitive plate has a plate opening and the interposed plate has a plate opening that are aligned with the deck opening to form a tube passage. The tube amplifier assembly also includes a power tube positioned within the tube passage and electrically coupled to the capacitive plate. The interposed plate, the capacitive plate, and the grounding deck form a capacitor assembly that is configured to provide capacitance of the tube amplifier assembly.

In an embodiment, a capacitor assembly is provided that includes a capacitive plate configured to extend parallel to and be coupled to a grounding deck of a tube amplifier assembly. The capacitive plate has a plate opening that extends transverse to a central axis. The capacitor assembly also includes an adapter wall mechanically coupled to the capacitive plate. The adapter wall has an inner surface that surrounds the central axis and defines a tube opening. The plate opening and tube opening combine to form a tube passage that is sized and shaped to receive a power tube of the tube amplifier assembly. The capacitor assembly also includes flexible conductive elements that are distributed along the inner surface of the adapter wall. The flexible conductive elements are configured to engage the power tube in the tube passage and electrically couple the power tube to the capacitive plate.

DETAILED DESCRIPTION

Figure 1:
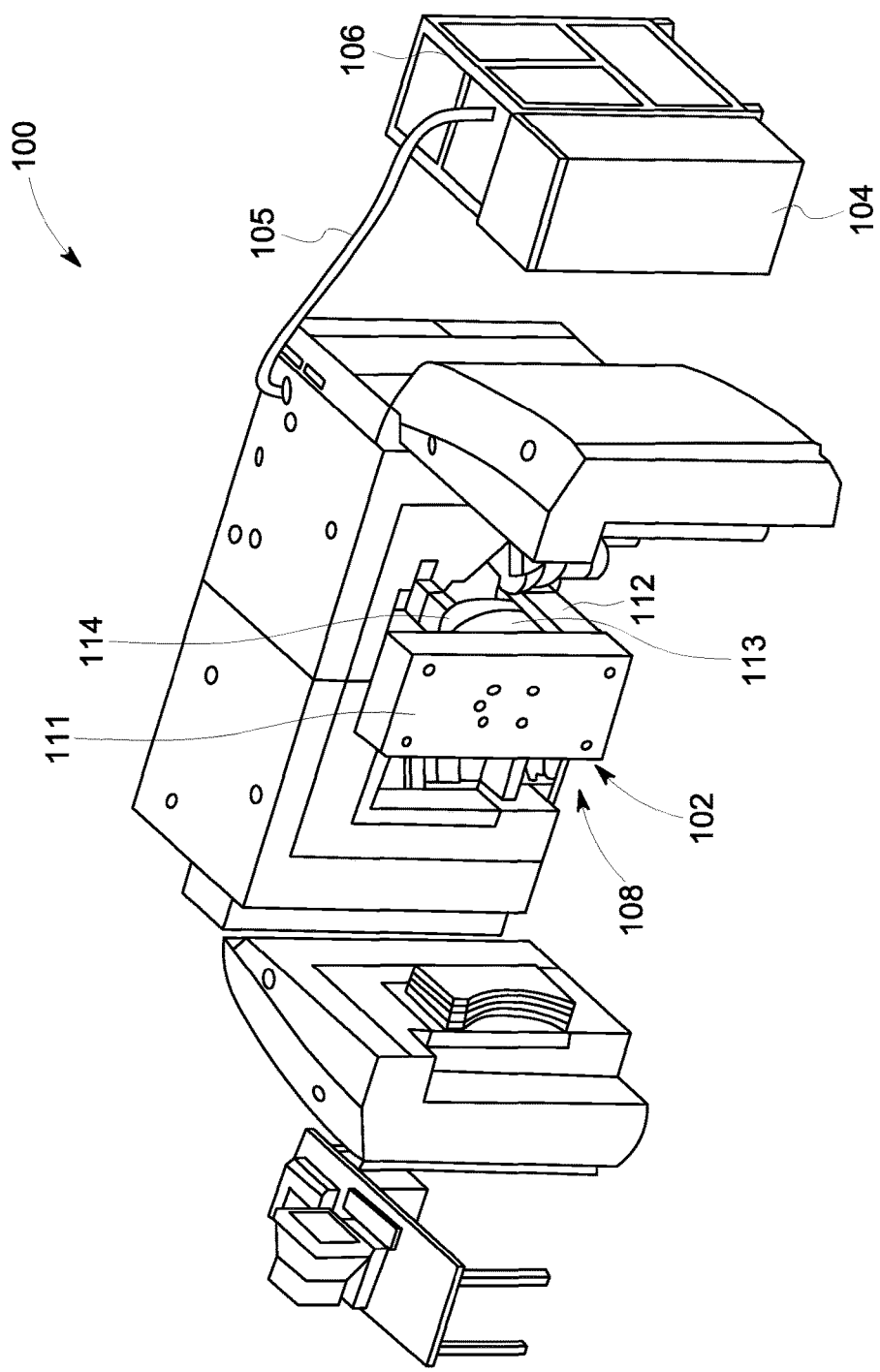
FIG. 1 is a perspective view of an isotope production system in accordance with an embodiment.

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. For example, one or more of the functional blocks (e.g., processors or memories) may be implemented in a single piece of hardware (e.g., a general purpose signal processor or a block of random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated, such as by stating "only a single" element or step. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Embodiments set forth herein include radio-frequency (RF) power generators and tube amplifier assemblies that include a power tube and at least one cavity resonator coupled to the power tube. The cavity resonators may include input and output cavity resonators (or cathode and anode cavity resonators, respectively) that may be, for example, coaxial transmission line resonators that each include an inner conductor and an outer conductor. The input and output cavity resonators may be characterized as high-Q resonators that are configured to operate at a designated frequency, such as within the very high frequency (VHF) band or higher (e.g., at least 30 MHz). As one example, the designated frequency may be 100 MHz. The input and output resonators may be ¼ wavelength resonators (or λ/4 resonators). In particular embodiments, embodiments have a grounded-grid configuration such that the power tube is cathode-driven and has a control grid that is operated at RF ground.

In some embodiments, the power tube is a triode having a grounded grid configuration. In particular embodiments, the power tube does not include and is not connected to a conventional socket. The power tube may include flexible leads (also referred to as flying leads). Embodiments may also include capacitor assemblies that are configured add capacitance to corresponding cavity resonators.

Although the RF power generators and the tube amplifier assemblies described herein are used to supply power to a particle accelerator, it should be understood that the RF power generators and tube amplifier assemblies may be used in other applications. In particular embodiments, the RF power generators or tube amplifier assemblies may be high power systems that are capable of generating, for example, 1,000 W or more and 500 V or more.

A technical effect provided by one or more embodiments may include a mechanism for increasing capacitance of a tube amplifier assembly or, more specifically, a cavity resonator of the tube amplifier assembly that includes a power tube. The added capacitance may increase an efficiency of the tube amplifier assembly, reduce power consumption of the tube amplifier assembly, and/or reduce overall cost of the tube amplifier assembly. In some cases, the added capacitance may increase the resonance Q-value and thereby reduce distortion. Another technical effect may include a mechanism for monitoring signals at the cathode of the power tube. In particular, embodiments may monitor a waveform of the signals at the cathode to calculate a phase difference of the signal at the cathode relative to a monitored signal at the anode of the power tube. The phase may provide information regarding an amplifier load. By monitoring the phase difference or waveform of the signals, the RF-frequency may be controlled (e.g., within 1% of an operating frequency, such as about 100 MHz) to control a load condition, which may affect total system efficiency by reducing losses. Another technical effect may include a mechanism for holding the power tube and/or cathode resonator (or inner conductor) at a designated position relative to other components. Another technical effect may include an assembly process that reduces manufacturing tolerances and/or an assembly process that is simpler than know processes. Another technical effect may include the ability to operate power tubes with flexible leads (or flying leads) at 100 MHz or higher. Although the above provides examples of technical effects that may be provided by embodiments set forth herein, it should be understood that embodiments are not required to provide each of the technical effects. For instance, one or more embodiments may achieve only one of the technical effects.

FIG. 1 is a perspective view of an isotope production system 100 in accordance with an embodiment. The isotope production system 100 includes a particle accelerator 102 that is operably coupled to a control cabinet 104 and a RF power generator 106. In the illustrated embodiment, the particle accelerator 102 is an isochronous cyclotron, but other types of particle accelerators may be used. RF energy or power is supplied to the particle accelerator 102 through an RF cable 105. As shown, the particle accelerator 102 includes a magnet assembly 108 that includes yoke sections 111, 112 and electromagnets 113, 114 that are coupled to the yoke sections 111, 112, respectively.

Figure 2:
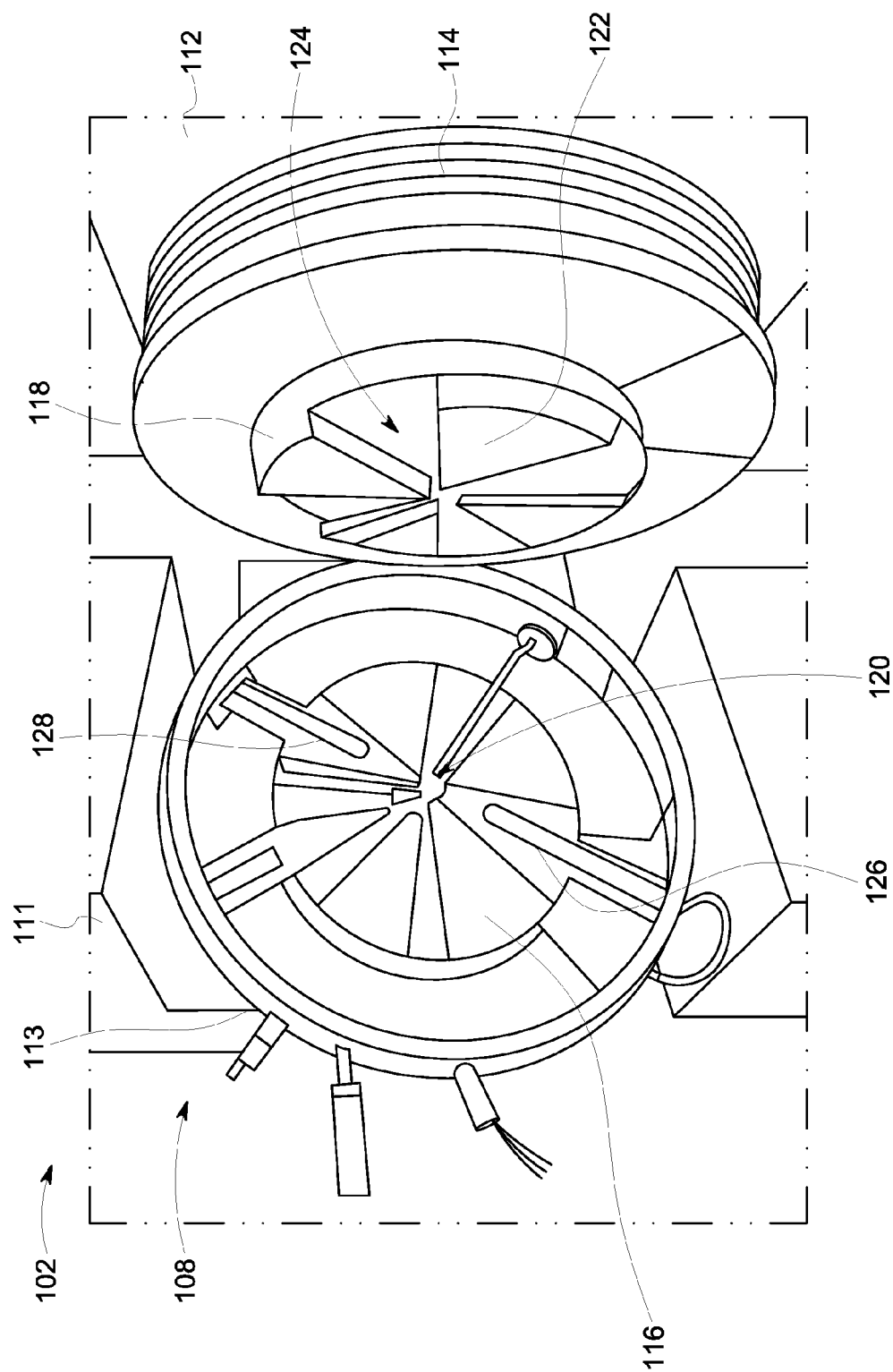
FIG. 2 illustrates a perspective view of the isotope production system of FIG. 1 having a cyclotron that is opened to illustrate components of the cyclotron.

FIG. 2 is a perspective view of a portion of the particle accelerator 102. Although the following description is with respect to the particle accelerator 102 being a cyclotron, it is understood that embodiments may include other particle accelerators and sub-systems of the same. As shown in FIG. 2, the particle accelerator 102 includes the magnet assembly 108 having the yoke sections 111, 112 and the electromagnets 113, 114. The electromagnets 113, 114 are magnet coils in the illustrated embodiment. The particle accelerator 102 may also include pole tops 116, 118. The pole top 116 is secured to the yoke section 111, and the pole top 118 is secured to the yoke section 112. As shown, the yoke section 112 is rotatably coupled to the yoke section 111. During operation, the yoke section 112 is in a closed position (as shown in FIG. 1) such that the pole tops 116, 118 oppose each other and an acceleration chamber is defined therebetween. When the particle accelerator 102 is not operating, the yoke section 112 may be opened to allow access to the acceleration chamber.

The acceleration chamber is configured to allow charged particles, such as $^1H^-$ ions, to be accelerated therein along a predetermined curved path that wraps in a spiral manner about an axis that extends between centers of the opposing pole tops 116, 118. The charged particles are initially positioned proximate to a central region 120 of the acceleration chamber. When the particle accelerator 102 is activated, the path of the charged particles may orbit around the axis that extends between the pole tops 116, 118. In particular embodiments, the pole top 118 includes hills 122 and valleys 124. The particle accelerator 102 also includes a pair of RF electrodes 126, 128 that are positioned adjacent to the pole top 116. The RF electrodes 126, 128 are sized and shaped to be received within corresponding valleys 124 of the pole tope 118 when the yoke section 112 is closed.

The RF electrodes 126, 128 are configured to be energized by the RF power generator 106 (FIG. 1) to generate an electrical field. The magnetic field is provided by the yoke sections 111, 112 and the electromagnets 113, 114. When the electromagnets 113, 114 are activated, a magnetic flux may flow between the pole tops 116, 118 and through the yoke sections 111, 112 around the acceleration chamber. When the electrical field is combined with the magnetic field, the particle accelerator 102 may direct the particles along the predetermined orbit. The RF electrodes 126, 128 cooperate with each other and form a resonant system that includes inductive and capacitive elements tuned to a predetermined frequency (e.g., 100 MHz). Accordingly, the RF electrodes 126, 128 are controlled by the RF power generator 106 to accelerate the charged particles.

In particular embodiments, the system 100 uses $^1H^-$ technology and brings the charged particles (negative hydrogen ions) to a designated energy with a designated beam current. In such embodiments, the negative hydrogen ions are accelerated and guided through the particle accelerator 102. The negative hydrogen ions may then hit a stripping foil (not shown) such that a pair of electrons are removed and a positive ion, $^1H^+$ is formed. The positive ion may be directed into an extraction system (not shown). However, embodiments described herein may be applicable to other types of particle accelerators and cyclotrons. For example, in alternative embodiments, the charged particles may be positive ions, such as $^1H^+$, $^2H^+$, and $^3He^+$. In such alternative embodiments, the extraction system may include an electrostatic deflector that creates an electric field that guides the particle beam toward the target material.

The system 100 is configured to produce radioisotopes (also called radionuclides) that may be used in medical imaging, research, and therapy, but also for other applications that are not medically related, such as scientific research or analysis. When used for medical purposes, such as in Nuclear Medicine (NM) imaging or Positron Emission Tomography (PET) imaging, the radioisotopes may also be called tracers. By way of example, the system 100 may generate protons to make $^{18}F^-$ isotopes in liquid form, $^{11}C$ isotopes as $CO_2$, and $^{13}N$ isotopes as $NH_3$. The target material used to make these isotopes may be enriched $^{18}O$ water, natural $^{14}N_2$ gas, $^{16}O$-water. In some embodiments, the system 100 may also generate protons or deuterons in order to produce $^{15}O$ gases (oxygen, carbon dioxide, and carbon monoxide) and $^{15}O$ labeled water.

The system 100 may also be configured to accelerate the charged particles to a predetermined energy level. For example, some embodiments described herein accelerate the charged particles to an energy of approximately 18 MeV or less. In other embodiments, the system 100 accelerates the charged particles to an energy of approximately 16.5 MeV or less. In particular embodiments, the system 100 accelerates the charged particles to an energy of approximately 9.6 MeV or less. In more particular embodiments, the system 100 accelerates the charged particles to an energy of approximately 7.8 MeV or less. However, embodiments describe herein may also have an energy above 18 MeV. For example, embodiments may have an energy above 100 MeV, 500 MeV or more. Likewise, embodiments may utilize various beam current values. By way of example, the beam current may be between about of approximately 10-30 μA. In other embodiments, the beam current may be above 30 μA, above 50 μA, or above 70 μA. Yet in other embodiments, the beam current may be above 100 μA, above 150 μA, or above 200 μA.

Figure 3:
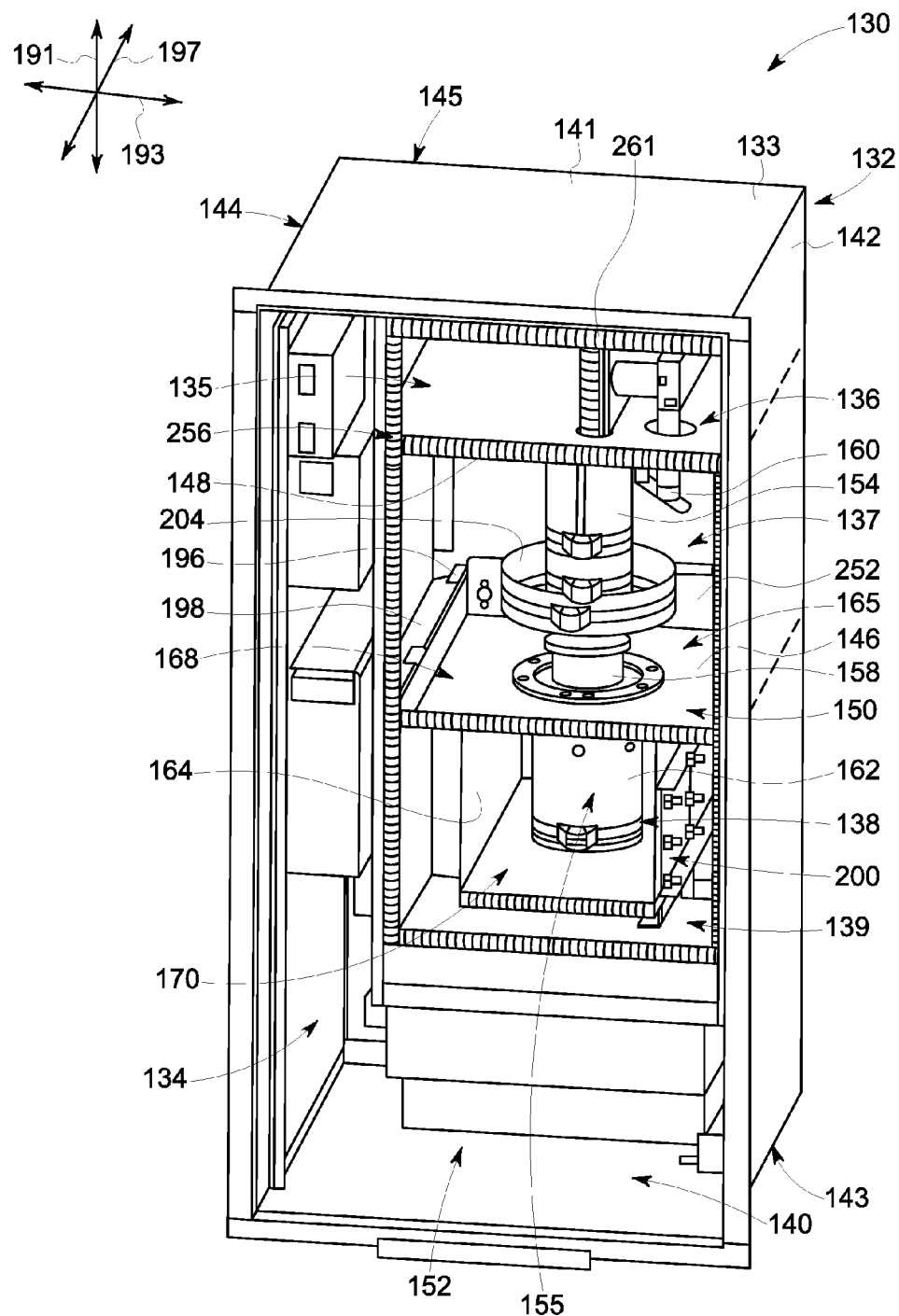
FIG. 3 is a perspective view of a radio frequency (RF) power generator having a tube amplifier assembly in accordance with an embodiment.

FIG. 3 is a perspective view of a RF power generator 130, which may be used with an isotope production system, such as the isotope production system 100 (FIG. 1). It is contemplated, however, that the RF power generator 130 may be used in other applications that require RF power amplification. The RF power generator 130 may be similar to the RF power generator 106 (FIG. 1) and configured to energize RF electrodes, such as the RF electrodes 126, 128 (FIG. 2). The RF power generator 130 includes a generator housing 132, which may be referred to as a cabinet in some embodiments. The generator housing 132 houses a number of interconnected components of the RF power generator 130 that cooperate in generating a sufficient amount of electric power for operating the RF electrodes.

The generator housing 132 defines a housing cavity 134 that may be divided or apportioned by interior walls to form compartments 135-140. The generator housing 132 may include an outer enclosure 133 having external walls 141-145. In some embodiments, the external walls 141-145 face an exterior space that is readily accessible to individuals and/or that has equipment positioned adjacent to one or more of the external walls 141-145. As such, the generator housing 132 and other internal shielding structures may be configured to obtain a designated electromagnetic compliance (EMC). More specifically, the generator housing 132 may be configured to reduce leakage of electromagnetic energy into the exterior space. Embodiments configured to obtain a designated EMC are described in U.S. patent application Ser. No. 14/575,958, which is incorporated herein by reference in its entirety.

As shown, the RF power generator 130 is oriented with respect to mutually perpendicular axes, including a longitudinal axis 191, a lateral axis 193, and a depth axis 197. The lateral axis 193 extends laterally between the external walls 142, 144. The longitudinal axis 191 may be a vertical axis that extends parallel to the force of gravity, and the depth axis 197 may extend into the housing cavity 134. It is contemplated that the longitudinal axis 191 in other embodiments may not extend parallel to the force of gravity.

The generator housing 132 includes a conductive frame 256 that surrounds and defines openings to the compartments 135-139. The conductive frame 256 may include, for example, flexible conductive elements 257 (e.g., contact springs, spring fingers, and the like) that are configured to engage an access panel (not shown). The compartments 137-139 collectively form an interior space 155 that is configured to receive at least a majority of the primary components of a tube amplifier assembly 170. As described herein, the tube amplifier assembly 170 includes a movable tray assembly 165 that may include a plurality of interconnected components of the tube amplifier assembly 170.

The movable tray assembly 165 allows for the components to be assembled, serviced, and/or tested outside of the interior space 155 and then moved, as a unit, into the interior space 155. The movable tray assembly 165 may divide the interior space 155 into the compartments 137-139 when the movable tray assembly 165 is operably positioned within the interior space 155. Moreover, the movable tray assembly 165 may be movable to different levels along the longitudinal axis 191. Moving the movable tray assembly 165 along the longitudinal axis 191 may effectively change a length of one or more resonators of the tube amplifier assembly 170. As such, moving the movable tray assembly along the longitudinal axis 191 may be referred to as coarse tuning the tube amplifier assembly 170. The movable tray assembly 165 is described in greater detail in U.S. application Ser. No. 14/575,993, which is incorporated herein by reference in its entirety. The generator housing 132 may also have an housing door (not shown) that provides general access to the housing cavity 134 and may cover the housing cavity 134 during operation of the RF power generator 130.

The compartment 137 may be hereinafter referred to as an output cavity 137, and the compartment 138 may be hereinafter referred to as a input cavity 138. The compartments 135-140 may be defined by interior conductor walls that are positioned within the housing cavity 134. For example, the interior conductor walls include a grounding deck 146 and a shorting deck 148. The grounding deck 146 is part of the movable tray assembly 165 and separates the output and input cavities 137, 138. The grounding deck 146 may have an input side that faces the input cavity 138 and an output side that faces the output cavity 137. One or more of the conductor walls may include apertures 150 that permit air to flow therethrough. For example, the RF power generator 130 may include a thermal control unit 152 (e.g., air cooling unit) that circulates air within the housing cavity 134.

Operative components of the RF power generator 130 that are disposed within the output cavity 137 may include an output inner conductor 154, a tuning capacitor assembly 204, and a power tube 158. The output cavity 137 may also include an output coupling loop (or pickup loop) 160 therein. The input cavity 138 may be at least partially defined by a conductor sub-assembly 164 and include an input inner conductor 162 therein. A portion of the power tube 158 may extend within the input cavity 138. In the illustrated embodiment, the conductor sub-assembly 164 is U-shaped and secured to the grounding deck 146. The grounding deck 146 and the conductor sub-assembly 164 may collectively form a support frame 168 of the movable tray assembly 165. As shown, the RF power generator 130 also includes multi-layered decoupling capacitors 200 that are secured to the conductor sub-assembly 164. The decoupling capacitors 200 are described in U.S. application Ser. No. 14/575,885, which is incorporated herein by reference in its entirety.

In some embodiments, the grounding deck 146, the power tube 158, the input inner conductor 162, the conductor sub-assembly 164, and/or the tuning capacitor assembly 204 may form the movable tray assembly 165. The movable tray assembly 165 may be secured to the output inner conductor 154, the decoupling capacitors 200, cooling tubes (not shown), and a supply cable (not shown) to form the tube amplifier assembly 170. In an exemplary embodiment, the tube amplifier assembly 170 includes the support frame 168, the power tube 158, the tuning capacitor assembly 204, the decoupling capacitors 200, the input inner conductor 162, the output inner conductor 154, the coupling loop 160, and outer conductors formed by the RF power generator 130. The tube amplifier assembly 170 may include fewer or more components in other embodiments. In the illustrated embodiment, the tube amplifier assembly 170 includes an input cavity resonator 390 (FIG. 15) that is formed by the input inner conductor 162, an input outer conductor (not shown), and a cavity capacitor assembly 250.

Figure 4:
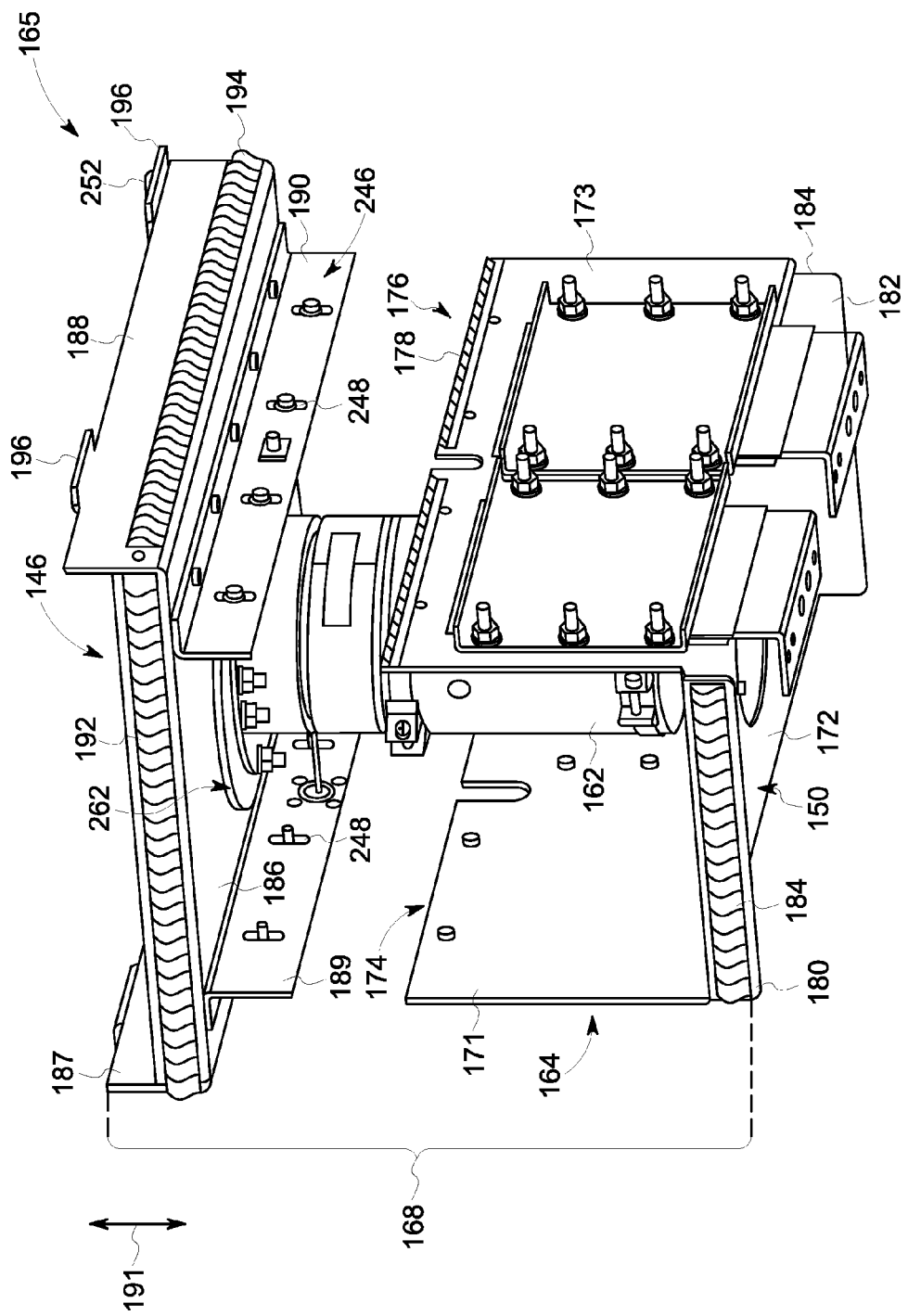
FIG. 4 is a partially exploded view of a movable tray assembly formed in accordance with an embodiment.

FIG. 4 is a partially exploded view of the movable tray assembly 165 in accordance with an embodiment. It should be understood that FIG. 4 and the accompanying description illustrate just one example of a movable tray assembly and that other embodiments may be assembled in accordance with the teachings herein. As shown in FIG. 4, the grounding deck 146 and the conductor sub-assembly 164 have been separated. The movable tray assembly 165 may include the input inner conductor 162 and a capacitor assembly 250. The capacitor assembly 250 is described below and may be used to couple the input inner conductor 162 to the grounding deck 146.

The conductor sub-assembly 164 may include a plurality of ground walls 171-173. In the illustrated embodiment, the ground walls 171-173 form a U-shaped structure, but other shapes may be formed by the ground walls 171-173. The ground wall 172 extends between and joins the ground walls 171, 173 and includes a plurality of the apertures 150 for airflow. The ground walls 171, 173 may project away from the input side of the grounding deck 146. The ground wall 172 is configured to electrically couple to the input inner conductor 162. The ground walls 171, 173 may include coupling edges 174, 176, respectively, that are configured to electrically couple to the grounding deck 146. For example, the ground walls 171, 173 may include conductive elements 178 along the coupling edges 174, 176.

Also shown in FIG. 4, the conductor sub-assembly 164 may include a front grounding panel 180 and a rear grounding panel 182 that each include a plurality of flexible conductive elements 184. For example, conductive elements may include elongated bodies (e.g., beams) that are configured to resiliently flex when engaging another component. When engaged to another component, the conductive elements may have a stored energy that continuously biases the conductive element against the other component so that the conductive elements contact and remain engaged to the other component during operation of the RF power generator 130 (FIG. 3).

The grounding deck 146 includes a base plate 186, a pair of sidewalls 187, 188, and a pair of structure supports 189, 190. The base plate 186 includes flexible conductive elements 192 positioned along a front end that are configured to engage the access panel (not shown). The grounding deck 146 may also include conductive elements (not shown) along a back end that are configured to engage an interior surface of the generator housing 132. Likewise, the sidewall 188 may include conductive elements 194 positioned therealong that are configured to engage an interior surface of the generator housing 132. The sidewall 187 may also include conductive elements 194 (shown in FIG. 5) positioned therealong for engaging another interior surface of the generator housing 132.

The structure supports 189, 190 are secured to the base plate 186 and are configured to couple to the ground walls 171, 173, respectively. The conductive elements 178 may engage the structure supports 189, 190. The structure supports 189, 190 may be L-shaped. In an exemplary embodiment, the conductor sub-assembly 164 is capable of being positioned at different distances with respect to the grounding deck 146. For example, the movable tray assembly 165 includes hardware 246 (e.g., screws, nuts, bolts, washers, etc.) and slots 248 that receive the hardware 246. The hardware 246 is used to secure the ground walls 171, 173 to the structure supports 189, 190, respectively. The ground walls 171, 173 include corresponding holes that receive the hardware 246. As shown, the slots 248 extend lengthwise along the longitudinal axis 191. The slots 248 permit the conductor sub-assembly 164 to be positioned at different distances relative to the grounding deck 146. In particular, the shorting deck 148 may be positioned at different distances with respect to the grounding deck 146 to change a length of the input cavity 138 (FIG. 3).

Figure 15:
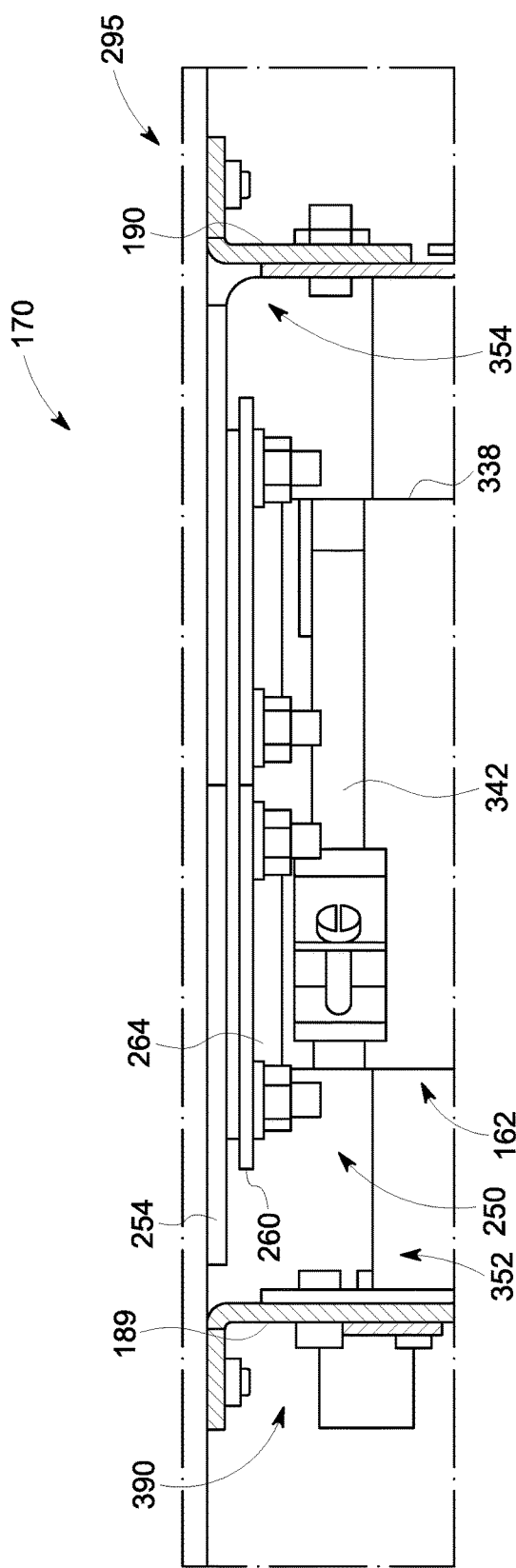
FIG. 15 illustrates a side view of an input circuit of the tube amplifier assembly showing a communication line that is coupled to the interposed plate.

Accordingly, the support frame 168 may provide conductive paths that extend from the ground walls 171, 173 to one or more of the conductive elements 184, 192, and 194 and, consequently, to the generator housing 132. The ground walls 171, 173 may be configured to electrically ground the decoupling capacitors 200. Moreover, the ground walls 171, 173 may form part of the outer conductor (not shown) of the input resonator 390 (FIG. 15).

The support frame 168 may include blocking tabs 196 that extend laterally away from the sidewalls 187, 188. Returning to FIG. 3, when the movable tray assembly 165 is positioned within the interior space 155, the movable tray assembly 165 is positioned between opposing ledge supports 198 of the generator housing 132. For example, the grounding deck 146 may extend between and be electrically coupled to inner surfaces of the ledge supports 198. During the positioning process, the movable tray assembly 165 may be initially positioned above the ledge supports 198 and then lowered in a direction along the longitudinal axis 191 such that a portion of the movable tray assembly 165 extends between the ledges supports 198. The blocking tabs 196 may be configured to prevent the movable tray assembly 165 from moving completely through the opening between the ledge supports 198. In alternative embodiments, the blocking tabs 196 may not be used and, instead, the ledge supports 198 may include tabs that prevent the movable tray assembly 165 from moving completely through the opening between the ledge supports 198. The movable tray assembly 165 is described in greater detail in U.S. application Ser. No. 14/575,993, which is incorporated herein by reference in its entirety.

Figure 5:
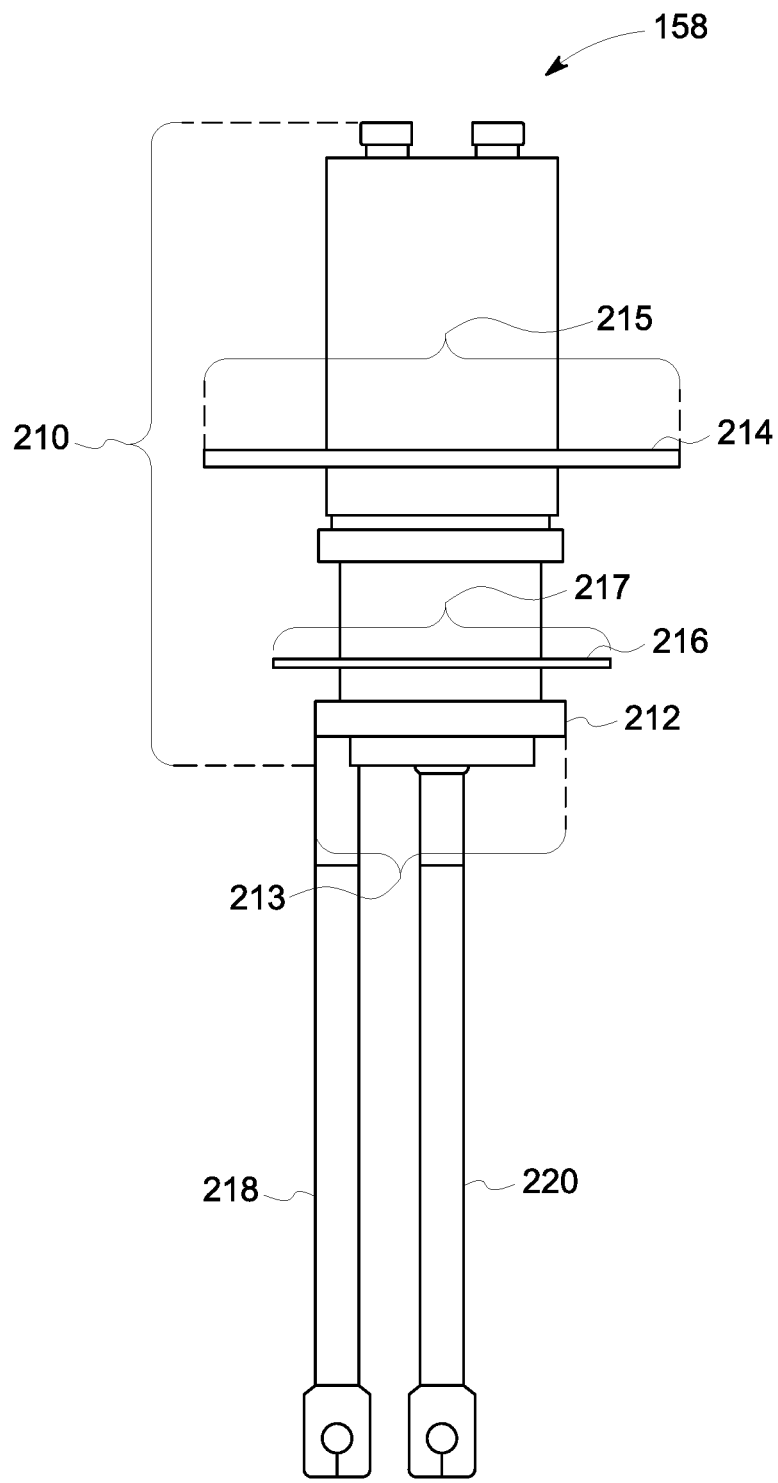
FIG. 5 is a side view of a power tube that may be used with the tube amplifier assembly of FIG. 3.

FIG. 5 is a side view of the power tube 158. In an exemplary embodiment, the power tube 158 is a power triode that includes a tube body 210 that is coupled to flexible leads 218, 220. The tube body 210 encloses a cathode, anode, and control grid (not shown) of the power tube 158. The power tube 158 also includes a cathode terminal 212, an anode terminal 214, and a grid terminal 216 that are each coupled to and supported by the tube body 210. The grid terminal 216 is a grid collar in the illustrated embodiment. The cathode terminal 212 is electrically coupled to the cathode electrode, the anode terminal 214 is electrically coupled to the anode electrode, and the grid terminal 216 is electrically coupled to the control grid.

In the illustrated embodiment, the power tube 158 also includes flexible leads 218, 220 that are electrically coupled to a filament within the tube body 210. The cathode may be heated by the filament, which receives current from the flexible lead 218. The heated filament causes the cathode to emit electrons, which flow through the power tube 158 toward the anode. The control grid is positioned between the cathode and anode and may be used to control the flow of the electrons. Although some embodiments may include a power tube having flexible or flying leads, it is contemplated that other embodiments may include a power tube that includes or is coupled to a conventional socket. Moreover, although the power tube 158 is a power triode in some embodiments, it should be understood that other power tubes may be used, such as tetrodes or pentodes.

As shown, the cathode terminal 212 has an terminal diameter 213, the anode terminal 214 has an terminal diameter 215, and the grid terminal 216 has a grid diameter 217. The grid diameter 217 may be greater than the terminal diameter 213 of the cathode terminal 212 and smaller than the terminal diameter 215 of the anode terminal 214.

Figure 6:
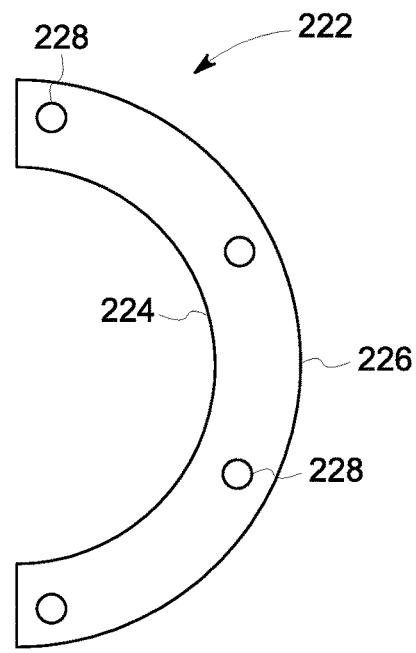
FIG. 6 illustrates an exemplary clamp section that may be used with the tube amplifier assembly of FIG. 3.

FIG. 6 is a plan view of a clamp section 222 that is configured to couple the power tube 158 (FIG. 3) to the grounding deck 146 (FIG. 3). In an exemplary embodiment, the clamp section 222 is combined with another clamp section 222 and configured to hold the grid terminal 216 (FIG. 5) against the base plate 186 (FIG. 3). In the illustrated embodiment, the clamp section 222 is C-shaped or semi-circular, but it should be understood that other shapes may be used. The clamp section 222 includes an inner edge 224 and an outer edge 226. The inner edge 224 has a radius that is less than the radius of the grid terminal 216, and the outer edge 226 has a radius that is greater than the radius of the grid terminal 216. The clamp section 222 also includes thru-holes 228 that are configured to receive hardware 242 (e.g., screws, nuts, bolts, washers, etc.) for securing the clamp section 222 to the grounding deck 146.

Figure 7:
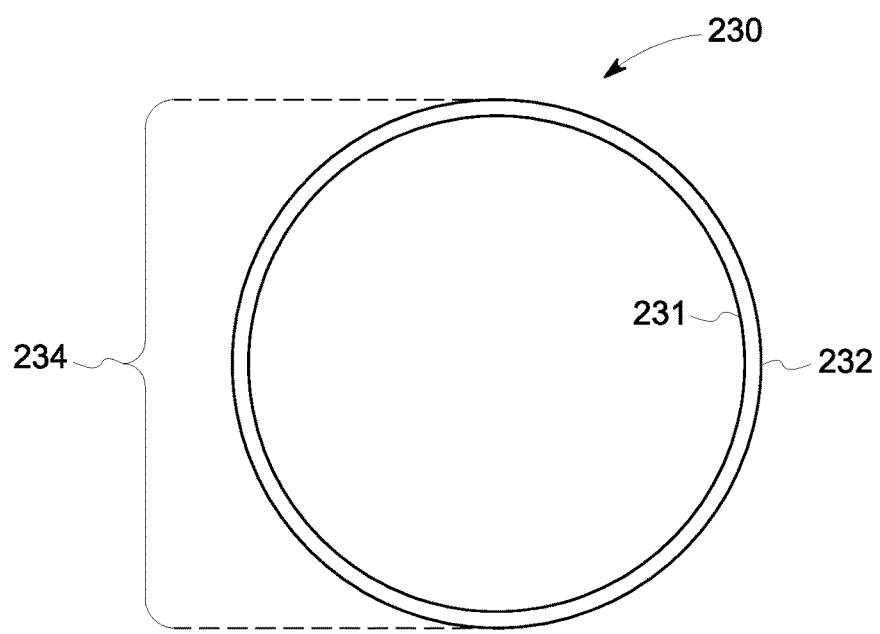
FIG. 7 is a plan view of a clamp ring that may be used with the tube amplifier assembly of FIG. 3.

FIG. 7 is a plan view of a clamp ring 230. The clamp ring 230 is configured to be positioned between two of the clamp sections 222 (FIG. 6) and the grounding deck 146 (FIG. 3) or, more specifically, the base plate 186 (FIG. 3) of the grounding deck 146. The clamp ring 230 has an inner edge 231 and an outer edge 232 that are sized and shaped relative to the clamp section 222. The inner edge 231 has a radius that is greater than the radius of the grid terminal 216. The clamp ring 230 is configured to separate the clamp sections 222 from the base plate 186. In the illustrated embodiment, the clamp ring 230 is configured to extend alongside the outer edges 224 of the clamp sections 222. As such, the clamp ring 230 may have a ring diameter 234 that is approximately equal to or slightly less than a clamp diameter (not shown) formed by the two clamp sections 222.

Figure 8:
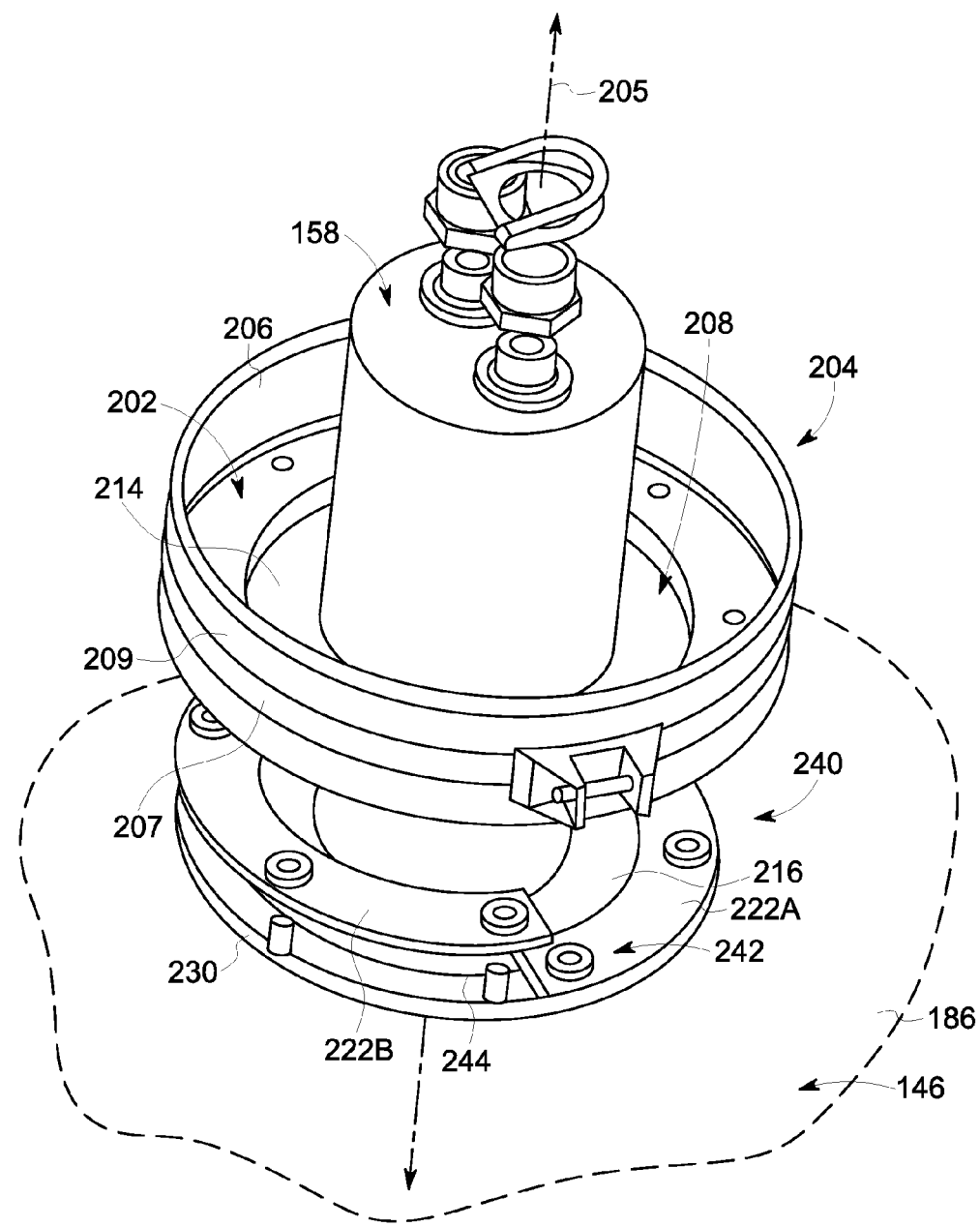
FIG. 8 is a perspective view of a portion of the tube amplifier assembly of FIG. 3.

FIG. 8 is a perspective view of an anode portion of the tube amplifier assembly 170. The tube amplifier assembly 170 may include a mounting assembly 240 that couples the power tube 158 to the base plate 186 of the grounding deck 146. The mounting assembly 240 includes two clamp sections 222A, 222B, the clamp ring 230, and the hardware 242. As shown, when the power tube 158 is operably positioned with respect to the clamp sections 222A, 222B and the clamp ring 230, an outer edge 244 of the grid terminal 216 is positioned under the clamp sections 222A, 222B. The grid terminal 216 is positioned on top of the base plate 186. The clamp sections 222A, 222B are positioned on top of the clamp ring 230, and the clamp ring 230 extends around the hardware 242.

Accordingly, the grid terminal 216 may be held between the base plate 186 and the clamp sections 222A, 222B. In some embodiments, the power tube 158 is permitted to have any rotational orientation with respect to the central axis 205. More specifically, conventional power tubes may require that thru-holes of the grid collar be aligned with corresponding holes of the base plate. In the illustrated embodiment, the thru-holes are not require to align with corresponding holes of the base plate 186, because the grid terminal 216 is compressed between the clamp sections 222A, 222B and the base plate 186.

In the illustrated embodiment, the tuning capacitor assembly 204 includes an output connector 202 having a connector wall 206 that surrounds a central axis 205 and defines a thru-hole 208 that receives the power tube 158. The output connector 202 is positioned on top of the anode terminal 214. The tuning capacitor assembly 204 also includes a tuning sheet 209 that surrounds the central axis 205 and interfaces with the connector wall 206. The tuning sheet 209 may be held against the connector wall 206 using a fastener, such as a belt 207. The tuning capacitor assembly 204 is described in greater detail in U.S. application Ser. No. 14/575,993, which is incorporated herein by reference in its entirety.

Figure 9:
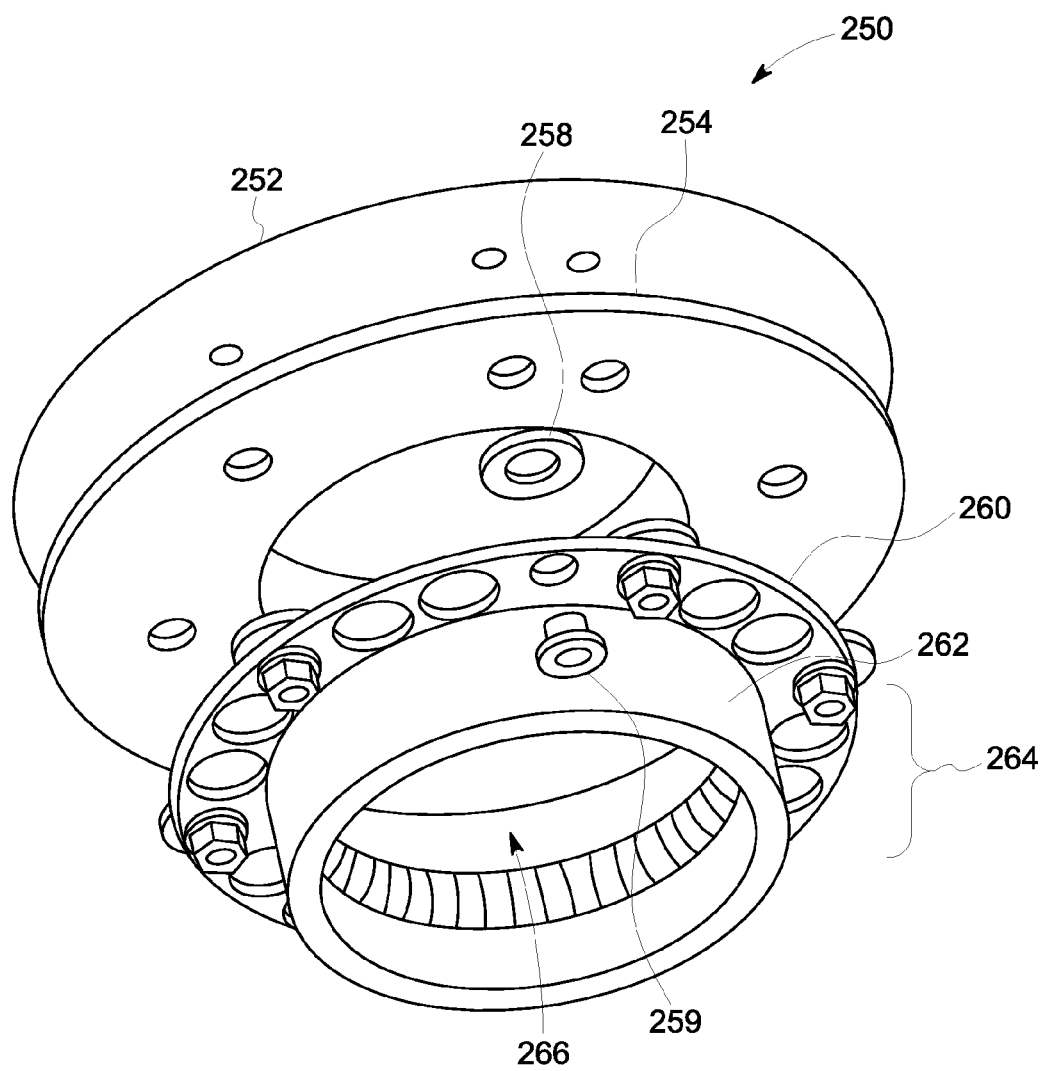
FIG. 9 is an exploded view of a capacitor assembly that may be used with the tube amplifier assembly of FIG. 3.
Figure 14:
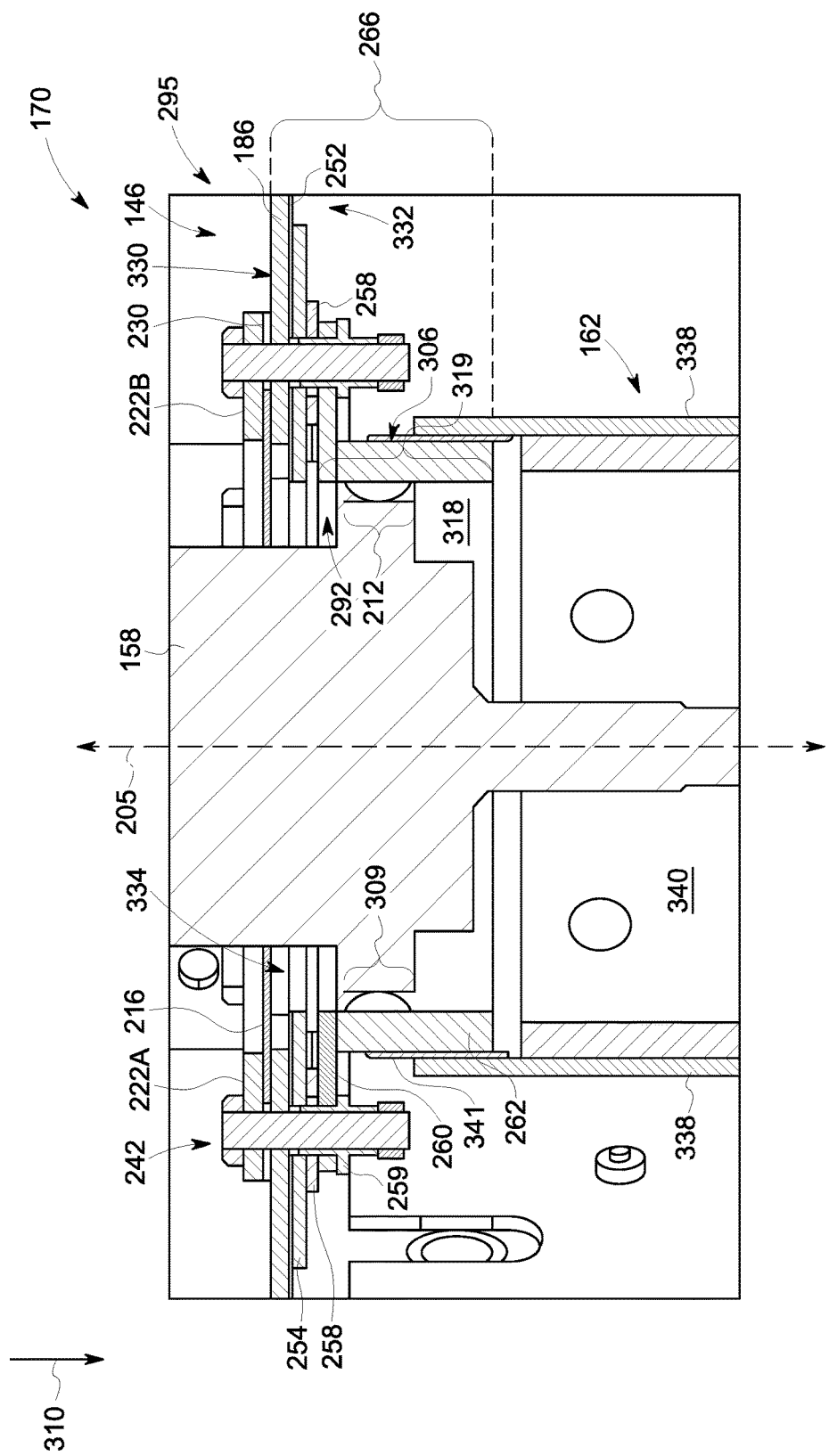
FIG. 14 is a cross-section of an input circuit of the tube amplifier assembly illustrating the capacitor assembly in greater detail.

FIG. 9 is an exploded view of the capacitor assembly 250 formed in accordance with an embodiment. The capacitor assembly 250 is configured to be positioned within the input cavity 138 (FIG. 3) and provide an added or external capacitance for an input circuit 295 (a portion of which is shown in FIGS. 14, 15), which may function similar to a resonant circuit or tuned circuit. The input circuit may constitute the input cavity resonator 390 and include the power tube 158 (FIG. 3), the input inner conductor 162 (FIG. 3), an input outer conductor (not shown), and the capacitor assembly 250. The power tube 158 is configured to resonate at a designated frequency that is based on a total capacitance of the input circuit and an inductance of the input circuit. The inductance is provided, at least in part, by the input inner conductor 162. The total capacitance is provided, at least in part, by an inherent capacitance (also called interelectrode capacitance) of the power tube 158 and an external (or added) capacitance that is provided by the capacitor assembly 250. The external capacitance is in parallel to the inherent capacitance. In some embodiments, the external capacitance may permit a shorter input inner conductor 162. The external capacitance may be greater than or less than the inherent capacitance. In some embodiments, the capacitor assembly 250 may allow the tube amplifier assembly 170 to be operated at 100 MHz or more.

In some embodiments, the external capacitance provided by the capacitor assembly 250 may reduce the likelihood of it being necessary to re-tune the tube amplifier assembly 170 (or input circuit) after the power tube 158 is replaced. During the lifetime operation of a tube amplifier assembly, it may be necessary to replace the used power tube with a newer power tube. Due to manufacturing tolerances, however, these power tubes may have different inherent capacitances. For example, the used power tube may have an inherent capacitance of 52 pico-Farad (pF), and the new power tube may have an inherent capacitance of 48 pF. If the difference in inherent capacitances is large enough, it may be necessary to tune the input circuit after the used power tube is replaced with the new power tube.

The capacitor assembly 250, however, reduces the likelihood that the input circuit must be tuned. As described above, the capacitor assembly 250 and the power tube 158 are in parallel such that the total capacitance of the input circuit is equal to the sum of the external capacitance and the inherent capacitance. Because the capacitor assembly 250 is in parallel with the power tube 158, any change in the total capacitance is effectively reduced by the added external capacitance. Using the above examples of the new power tube and the used power tube, the change in capacitance of the input circuit without the capacitor assembly 250 would be about 8% ((52−48)/52)*100). The capacitor assembly 250 would reduce the percent change in total capacitance. For example, assuming that the capacitor assembly 250 provides an external capacitance of 50 pF, the change in total capacitance of the input circuit with the capacitor assembly 250 would be about 4% ((102−98)/102)*100).

In the illustrated embodiment, the capacitor assembly 250 includes an insulation layer 252, an interposed (or pickup) plate 254, a plurality of insulative spacers 258, a plurality of insulated support sleeves 259, a capacitive plate 260, and an adapter wall 262. The capacitive plate 260 and the adapter wall 262 are coupled to each other to form a tube adapter 264. In some embodiments, the capacitor assembly 250 may not include the adapter wall 262. Each of the insulation layer 252, the interposed plate 254, the capacitive plate 260, and the adapter wall 262 have or form a corresponding opening that aligns with the other openings to form a tube passage 266 when the components are stacked together. The tube passage 266 is sized and shaped to receive the power tube 158 (FIG. 3).

The capacitor assembly 250 is configured to be coupled to the grounding deck 146 (FIG. 3). As used herein, the term "coupled" may mean directly or indirectly coupled. For example, a first component may be directly coupled to a second component such that surfaces of the first and second components engage each other. A first component may be indirectly coupled to a second component if the first and second components do not engage each other and, instead, an intervening component (or components) couples the first and second components to each other.

Figure 10:
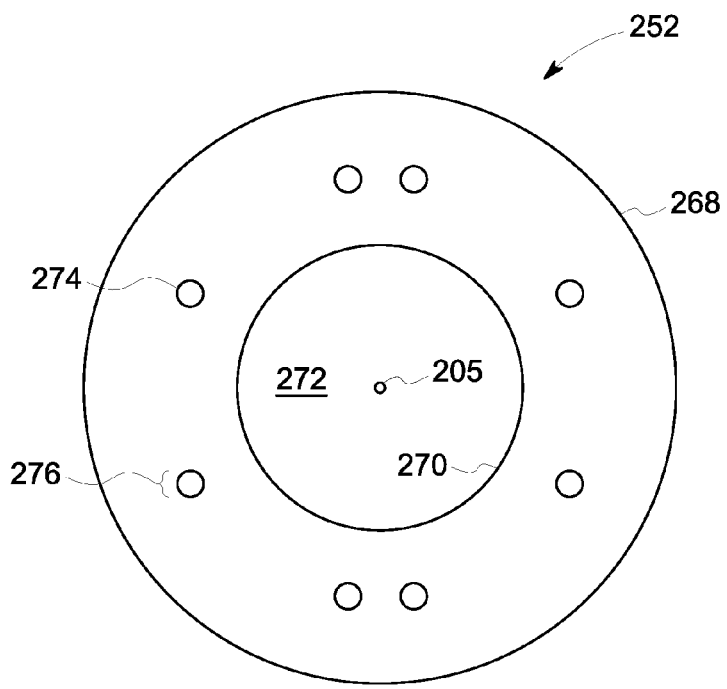
FIG. 10 is a plan view of an insulation layer that may be used with the tube amplifier assembly of FIG. 3.

FIG. 10 is a plan view of the insulation layer 252. The insulation layer 252 has an outer edge 268 that defines a perimeter of the insulation layer 252 and an inner edge 270 that defines a layer opening 272. The central axis 205 extends through a center of the layer opening 272. The perimeter forms a circle having a center at the central axis 205 in the illustrated embodiment, but other shapes may be formed in alternative embodiments. Also shown, the insulation layer 252 includes securing holes 274. The securing holes 274 are sized and shaped to receive the hardware 242 (FIG. 8) and are distributed around the central axis 205. Each of the securing holes 274 has a corresponding diameter 276.

Figure 11:
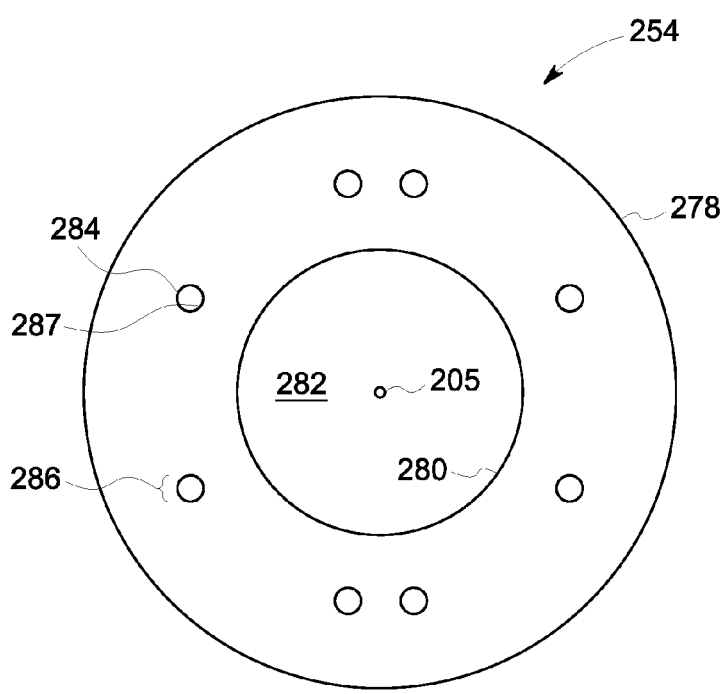
FIG. 11 is a plan view of an interposed plate that may be used with the tube amplifier assembly of FIG. 3.

FIG. 11 is a plan view of the interposed plate 254. The interposed plate 254 has an outer edge 278 that defines a perimeter of the interposed plate 254 and an inner edge 280 that defines a plate opening 282. The central axis 205 extends through a center of the plate opening 282. The plate opening 282 may have an identical size and shape as the layer opening 272 (FIG. 10). The perimeter forms a circle having a center at the central axis 205 in the illustrated embodiment.

Also shown, the interposed plate 254 includes securing holes 284. The securing holes 284 are sized and shaped to receive the hardware 242 (FIG. 8). The securing holes 284 are distributed around the central axis 205 and positioned to align with the securing holes 274 (FIG. 10). Each of the securing holes 284 has a corresponding diameter 286 that is defined by a hole edge 287. The corresponding diameter 286 may be greater than the diameter 276 (FIG. 10) of the securing holes 274 (FIG. 10). In an exemplary embodiment, the corresponding diameter 286 is configured such that a gap or spacing exists between the hole edge 287 and the hardware 242.

Figure 12:
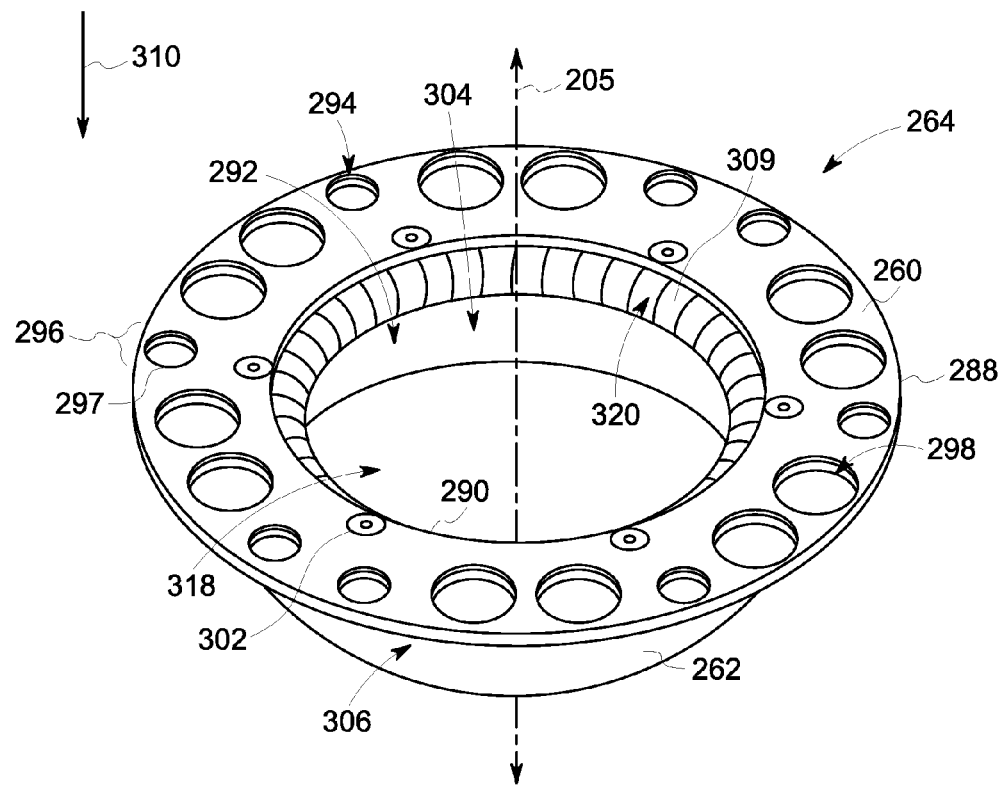
FIG. 12 is an isolated perspective view of a tube adapter that may be used with the tube amplifier assembly of FIG. 3.

FIG. 12 is an isolated perspective view of the tube adapter 264. The capacitive plate 260 has an outer edge 288 that defines a perimeter of the capacitive plate 260 and an inner edge 290 that defines a plate opening 292. The central axis 205 is configured to extend through a center of the plate opening 292. The perimeter forms a circle having a center at the central axis 205 in the illustrated embodiment. The shape of the perimeter may be similar to the shape of the perimeter of the interposed plate 254.

Also shown, the capacitive plate 260 includes securing holes 294. The securing holes 294 are sized and shaped to receive the hardware 242 (FIG. 8). The securing holes 294 are distributed around the central axis 205 and positioned to align with the securing holes 274 (FIG. 10) and the securing holes 284 (FIG. 11). Each of the securing holes 294 has a corresponding diameter 296 that is defined by a hole edge 297. The corresponding diameter 296 may be less than the diameter 286 (FIG. 11) of the securing holes 284. Optionally, the capacitive plate 260 has a plurality of openings 298 that are symmetrically distributed about the central axis 205. The openings 298 may be positioned, sized, and shaped to obtain a designated capacitance for the capacitor assembly 250.

The capacitor plate 260 may be secured to the adapter wall 262 using, for example, screws 302, but other fasteners may be used in alternative embodiments. In an exemplary embodiment, the capacitive plate 260 is stamped from sheet metal, and the adapter wall 262 is formed from a non-conductive material. In other embodiments, however, the adapter wall 262 may be formed from a conductive material. In other embodiments, the capacitor plate 260 and the adapter wall 262 are part of a single unitary part. For example, the capacitor plate 260 and the adapter wall 262 may be molded from a common material.

Figure 13:
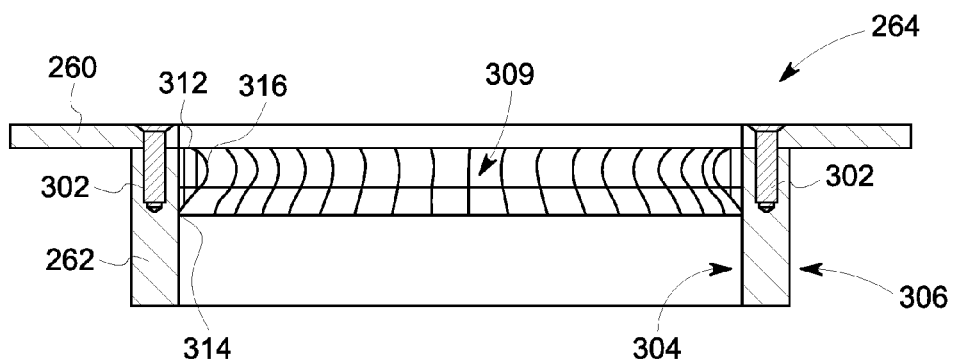
FIG. 13 is a cross-section of the tube adapter of FIG. 12.

FIG. 13 is cross-section of the tube adapter 264 through two of the screws 302. As shown in FIGS. 12 and 13, the adapter wall 262 has an inner surface 304 that faces radially inward toward the central axis 205. The adapter wall 262 also includes an outer surface 306 (FIG. 12) that faces radially away from the central axis 205. The tube adapter 264 includes a plurality of flexible conductive elements 309 that are electrically coupled to the capacitive plate 260. For example, the flexible conductive elements 309 may engage the capacitive plate 260 or be electrically coupled to the capacitive plate 260 through the adapter wall 262.

The flexible conductive elements 309 may be electrically coupled to the capacitive plate 260 and surround the tube passage 266. The flexible conductive elements 309 may form a conductive frame 320 that surrounds and engages the power tube 158 (FIG. 3) when the power tube 158 is disposed within the tube passage 266 (FIG. 9). The flexible conductive elements 309 may be referred to as contact springs, spring fingers, or the like. The flexible conductive elements 309 may be tightly distributed around the central axis 205 such that a nominal center-to-center spacing between adjacent flexible conductive elements 309 exists. Each of the flexible conductive elements 309 is shaped to engage the power tube 158 as the power tube 158 moves in a loading direction 310 that is parallel to the central axis 205. When moving along the loading direction 310, the power tube 158 extends through the plate opening 282 before passing through into a tube opening 318 defined by the adapter wall 262. The plate opening 292 and the tube opening 318 may combined to form an adapter opening of the tube adapter 264.

As shown in FIG. 13, each of the flexible conductive elements 309 extends from a base 312 to a distal end 314. In an exemplary embodiment, the flexible conductive elements 309 are spring fingers that extend away from the inner surface 304 of the adapter wall 262. The flexible conductive elements 309 are shaped to engage the power tube 158 as the power tube 158 is inserted into the tube passage 266. For example, each of the flexible conductive elements 309 may have an inflection point 316 that is closer to the central axis 205 (FIG. 12) than the inner surface 304. When the power tube 158 engages the flexible conductive elements 309, the flexible conductive elements 309 are deflected toward the inner surface 304. The flexible conductive elements 309 may electrically couple the power tube 158 to the capacitive plate 260.

FIG. 14 is a cross-section of a portion of the input circuit 295 of the tube amplifier assembly 170. The base plate 186 has an output side 330 and an input side 332 that face in opposite directions along the central axis 205. When the tube amplifier assembly 170 is fully constructed, the clamp sections 222A, 222B and the hardware 242 secure the grid terminal 216 such that the grid terminal 216 is held between the clamp sections 222A, 222B and the base plate 186. The pair of clamp sections 222A, 222B and each of the clamp ring 230, the grid terminal 216, the insulation layer 252, the interposed plate 254, the insulative spacers 258, the capacitive plate 260, the insulative support sleeves 259, and the adapter wall 262 are stacked with respect to each other along the central axis 205. Each bolt of the hardware 242 extends through one of the clamp sections 222A, 222B and the insulation layer 252, the interposed plate 254, a corresponding insulative spacer 258, a corresponding insulated support sleeve 259, and the capacitive plate 260. As such, the capacitor assembly 250 is secured to the base plate 186 with each of the insulation layer 252, the interposed plate 254, and the capacitive plate 260 extending parallel to the grounding deck 146 or the base plate 186. In particular embodiments, the hardware 242 includes threaded bolts (also referred to as studs or stud bolts) that are secured to nuts at each end. The base plate 186 (or the grounding deck 146) may include threaded holes. In such embodiments, the threaded holes may hold the threaded bolts while the elements of the capacitor assembly 250 are stacked relative to each other. Moreover, in this manner, it may be possible to remove the power tube 158 without disassembling the capacitor assembly 250 or the input resonator. For example, the nuts holding the clamp sections 222A, 222B may be removed thereby allowing the clamp sections 222A, 222B and the power tube 158 to be removed. However, the threaded bolts may remain secured to the threaded holes. Accordingly, the capacitor assembly 250 may remain assembled and secured to the grounding deck 146.

The interposed plate 254 is positioned between the grounding deck 146 and the capacitive plate 260. As shown, the interposed plate 254 is electrically separated from the grounding deck 146 and the capacitive plate 260. More specifically, the insulation layer 252 is disposed between the interposed plate 254 and the grounding deck 146, the insulative spacers 258 are disposed between the interposed plate 254 and the capacitive plate 260, and the insulated support sleeves 259 surround a portion of the threaded bolts. In the illustrated embodiment, the interposed plate 254 forms a part of the capacitor assembly 250. The interposed plate 254 may decrease an amount of capacitance provided by the capacitor assembly 250. For example, the capacitor assembly 250 with the electrically separated interposed plate 254 may be electrically similar to a pair of capacitors in series with respect to each other.

The grounding deck 146 (or the base plate 186) has a deck opening 334 therethrough. The deck opening 334 is sized and shaped to permit the power tube 158 to be inserted therethrough in the loading direction 310. The power tube 158 is configured to couple to the grounding deck 146 and be positioned within the deck opening 334. The deck opening 334 is configured to align with the layer opening 272, the plate opening 282, the plate opening 292, and the tube opening 318 to form the tube passage 266. The tube opening 318 and the plate opening 292 combine to form an adapter opening 319. For clarity, the layer opening 272 and the plate opening 282 are not referenced in FIG. 14. The tube passage 266 is sized and shaped to receive the power tube 158. As shown, the cathode terminal 212 is engaged to the flexible conductive elements 309 within the tube passage 266.

The tube adapter 264 may be coupled to the grounding deck 146. The input inner conductor 162 may include a coupling sheet 338. The coupling sheet 338 may be, for example, a sheet of conductive material that wraps around the adapter wall 262. In some embodiments, an insulative film 341 may be wrapped around the outer surface 306 of the adapter wall 262. The coupling sheet 338, in turn, is wrapped around the insulative film 341. As such, the insulative film 341 is positioned directly between the coupling sheet 338 and the outer surface 306. The insulative film 341 is configured to DC-isolate the input inner conductor 162 from the tube adapter 264. Also shown, the coupling sheet 338 defines a conductor passage 340. The flexible leads 218, 220 extend through the conductor passage 340 and couple to the decoupling capacitors 200 (FIG. 3).

FIG. 15 is a side view of an enlarged portion of the input circuit 295 of the tube amplifier assembly 170. The coupling sheet 338 of the input inner conductor 162 is secured to the tube adapter 264 using a belt 342. In the illustrated embodiment, the capacitor assembly 250 includes the capacitive plate 260 of the tube adapter 264 and the interposed plate 254. In other embodiments, however, the capacitor assembly 250 may only include the capacitive plate 260 without the interposed plate 254. The insulation layer 252 is not visible in FIG. 15. In other embodiments, the adapter wall 262 (FIG. 14) is not coupled to the capacitive plate 260 or is not utilized by the tube amplifier assembly 170.

Also shown in FIG. 15, the tube amplifier assembly 170 includes first and second communication lines 352, 354. The first communication line 352 includes a conductive pathway, such as a thin strip of sheet metal, that is electrically coupled to the input cavity resonator 390 and is configured to provide an excitation signal thereto. The first communication line 352 extends between the coupling sheet 338 and the structure support 189.

The second communication line 354 includes a conductive pathway, such as a thin strip of sheet metal, that is electrically coupled to the interposed plate 254. The second communication line 354 extends between the interposed plate 254 and the structure support 190. During operation of the tube amplifier assembly 170, signals generated by the input cavity resonator 390 may be detected by the interposed plate 254. The signals may be feedback signals that are indicative of an electrical performance of the input cavity resonator 390. For example, the signals from the interposed plate 254 may be used to calculate a load condition of an output of the tube amplifier assembly 170. The signals may be transmitted through the communication line 354 to a control system (not shown) of the tube amplifier assembly 170 or the RF power generator 130. As a pickup device, the interposed plate 254 and capacitor assembly 250 will function similar to a capacitive voltage divider without resonant behavior that parasitic inductance may cause. Accordingly, the measured waveform shape may be preserved.

The capacitor assembly 250 with the interposed plate 254 may function as a capacitive divider of the cathode voltage directly at the cathode terminal 212. In some embodiments, the interposed plate 254 may function as a pickup device that detects signals from the input cavity resonator 390. As described above, in particular embodiments, the capacitor assembly 250 and the power tube 158 are co-axial with respect to the central axis 205, and the capacitor assembly 250 is symmetrical (i.e., circular or cylindrical) about the central axis 205 and the power tube 158. In such embodiments, the coaxially-positioned and symmetrical capacitor assembly 250 may have a low self-inductance that enables the interposed plate 254 to detect measurements of high frequency signals (harmonics of the fundamental frequency) with low distortion. Moreover, the circular or cylindrical geometry of the capacitor assembly 250 may allow the first and second communication lines 352, 354 to be coupled to the capacitor assembly 250 at any rotational angle. In some embodiments, an impedance from the cathode terminal 212 to the grounding deck 146 at harmonics is corrected by the capacitor assembly 250 shaping the waveform of the excitation signal to improve amplifier efficiency. In some embodiments, the capacitor assembly 250 may have a low parasitic inductance and the cylindrical symmetry of the capacitor assembly 250 may permit measurements of high frequency signals (harmonics of the fundamental frequency) with low distortion.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

This written description uses examples to disclose the various embodiments, and also to enable a person having ordinary skill in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, or the like). Similarly, the programs may be stand alone programs, may be incorporated as subroutines in an operating system, may be functions in an installed software package, or the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "comprises," "including," "includes," "having," or "has" an element or a plurality of elements having a particular property may include additional such elements not having that property.

What is claimed is:

1. A capacitor assembly comprising:
   a capacitive plate configured to extend parallel to and be coupled to a grounding deck of a tube amplifier assembly, the capacitive plate having a plate opening that extends transverse to a central axis;
   an adapter wall mechanically coupled to the capacitive plate, the adapter wall having an inner surface that surrounds the central axis and defines a tube opening, the plate opening and tube opening combining to form a tube passage that is sized and shaped to receive a power tube of the tube amplifier assembly; and
   flexible conductive elements distributed along the inner surface of the adapter wall, wherein the flexible conductive elements are configured to engage the power tube in the tube passage and electrically couple the power tube to the capacitive plate.

2. The capacitor assembly of claim 1, wherein the capacitive plate has an outer diameter and the adapter wall has an outer diameter, the outer diameter of the capacitive plate being greater than the outer diameter of the adapter wall.

3. The capacitor assembly of claim 1, wherein the capacitive plate has a plurality of openings that are symmetrically distributed about the central axis.

4. The capacitor assembly of claim 1, further comprising an interposed plate that is configured to be positioned between and electrically separated from the grounding deck and the capacitive plate, the interposed plate including a plate opening that forms a portion of the tube passage that receives the power tube.

5. The capacitor assembly of claim 4, wherein the interposed plate decreases an amount of capacitance provided by the capacitor assembly.

6. The capacitor assembly of claim 4, wherein the capacitive plate includes securing holes and the interposed plate includes securing holes, the securing holes of the capacitive plate and the interposed plate configured to align and receive hardware for mechanically coupling the capacitive plate and the interposed plate to the grounding deck.

7. The capacitor assembly of claim 4, further comprising a communication line coupled to the interposed plate, the communication line configured to transmit signals detected by the interposed plate during operation of the tube amplifier assembly.

8. The capacitor assembly of claim 7, wherein the signals are generated by an input cavity resonator of the tube amplifier assembly.

9. The capacitor assembly of claim 7, wherein the capacitive plate and the interposed plate form a capacitive voltage divider.

10. The capacitor assembly of claim 9, wherein the capacitive voltage divider is essentially devoid of resonant behavior caused by parasitic inductance.

11. The capacitor assembly of claim 4, further comprising an insulative spacer that is configured to separate the capacitive plate and the interposed plate by a predetermined distance.

12. The capacitor assembly of claim 4, wherein the interposer plate and the capacitive plate are configured to be stacked with respect to the grounding deck, the interposer plate being electrically separated from the grounding deck by an insulative material and electrically separated from the capacitive plate by an insulative material.

13. The capacitor assembly of claim 4, further comprising an insulation layer that is stacked adjacent to the interposed plate, the interposed plate and the insulation layer having respective securing holes that align with each other, wherein the securing hole of the interposed plate has a larger diameter than a diameter of the securing hole of the insulation layer.

14. The capacitor assembly of claim 1, further comprising a conductive coupling sheet that is wrapped about the central axis and the adapter wall.

15. The capacitor assembly of claim 1, wherein the adapter wall is formed from a non-conductive material.

16. The capacitor assembly of claim 1, wherein the adapter wall and the capacitor plate are molded from a common material such that the adapter wall and the capacitor plate are portions of a single unitary structure.

17. The capacitor assembly of claim 1, wherein the flexible conductive elements directly engage the capacitive plate.

18. The capacitor assembly of claim 1, wherein the power tube of the tube amplifier assembly and the capacitor assembly are configured to be co-axial with respect to the central axis, the capacitor assembly configured to be symmetrical about the central axis and the power tube.

19. The capacitor assembly of claim 1, further comprising the power tube, the power tube having flexible leads.

20. The capacitor assembly of claim 1, wherein the power tube is a triode having a grounded grid configuration.

\* \* \* \* \*